(12) United States Patent
Lv et al.

(10) Patent No.: US 10,305,035 B2
(45) Date of Patent: May 28, 2019

(54) PREPARATION METHOD OF CU-BASED RESISTIVE RANDOM ACCESS MEMORY

(71) Applicant: THE INSTITUTE OF MICROELECTRONICS OF CHINESE ACADEMY OF SCIENCES, Beijing (CN)

(72) Inventors: Hangbing Lv, Beijing (CN); Ming Liu, Beijing (CN); Qi Liu, Beijing (CN); Shibing Long, Beijing (CN)

(73) Assignee: THE INSTITUTE OF MICROELECTRONICS OF CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 15/744,063

(22) PCT Filed: Apr. 22, 2016

(86) PCT No.: PCT/CN2016/080021
§ 371 (c)(1),
(2) Date: Jan. 12, 2018

(87) PCT Pub. No.: WO2017/181471
PCT Pub. Date: Oct. 26, 2017

(65) Prior Publication Data
US 2018/0205014 A1 Jul. 19, 2018

(51) Int. Cl.
*H01L 45/00* (2006.01)
*H01L 27/24* (2006.01)
*G11C 13/00* (2006.01)

(52) U.S. Cl.
CPC ...... *H01L 45/1266* (2013.01); *H01L 27/2436* (2013.01); *H01L 45/085* (2013.01);
(Continued)

(58) Field of Classification Search
CPC ............... H01L 45/1266; H01L 45/085; H01L 45/1233; H01L 45/16; H01L 45/1666;
(Continued)

(56) References Cited

U.S. PATENT DOCUMENTS 6,046,108 A * 4/2000 Liu ..................... H01L 21/7684
257/E21.583
7,396,759 B1 * 7/2008 van Schravendijk ........................
H01L 21/76834
257/E21.575

(Continued)

FOREIGN PATENT DOCUMENTS

CN 105789438 A 7/2016

*Primary Examiner* — Cheung Lee
*Assistant Examiner* — Stephen C Smith
(74) *Attorney, Agent, or Firm* — Platinum Intellectual Property LLP

(57) ABSTRACT

The present invention discloses a preparation method of a Cu-based resistive random access memory, and a memory. The preparation method includes: forming a copper wire in a groove through a Damascus copper interconnection process, wherein the copper wire includes a lower copper electrode for growing a storage medium, and the copper wire is arranged above a first capping layer; forming a second capping layer above the copper wire; forming a hole at a position corresponding to the lower copper electrode on the second capping layer, wherein the pore is used for exposing the lower copper electrode; performing composition and a chemical combination treatment on the lower copper electrode to generate a compound barrier layer, wherein the compound barrier layer is a compound formed by the chemical combination of elements Cu, Si and N, or a compound formed by the chemical combination of elements Cu, Ge and N; and depositing a solid electrolyte material and an upper electrode on the compound barrier layer. By means of the above technical solution, the technical problem of
(Continued)

higher injection efficiency of Cu ions in the Cu-based resistive random access memory in the prior art is solved, and the fatigue properties of the memory are improved.

13 Claims, 3 Drawing Sheets

(52) U.S. Cl.
CPC .......... *H01L 45/1233* (2013.01); *H01L 45/16* (2013.01); *H01L 45/1666* (2013.01); *H01L 45/1683* (2013.01); *G11C 13/0011* (2013.01); *G11C 2213/52* (2013.01); *G11C 2213/79* (2013.01); *H01L 45/142* (2013.01); *H01L 45/146* (2013.01)

(58) Field of Classification Search
CPC . H01L 45/1683; H01L 45/142; H01L 45/146; H01L 21/82; H01L 27/2436; G11C 13/0011; G11C 2113/52; G11C 2113/79
See application file for complete search history.

(56) References Cited

U.S. PATENT DOCUMENTS

| | | | | |
|---|---|---|---|---|
| 7,858,519 B2* | 12/2010 | Liu | .................... | H01L 21/76846 |
| | | | | 257/751 |
| 8,422,295 B1* | 4/2013 | Lin | ...................... | G11C 14/009 |
| | | | | 365/185.08 |
| 2009/0134521 A1* | 5/2009 | Liu | .................. | H01L 21/76846 |
| | | | | 257/762 |

\* cited by examiner

PREPARATION METHOD OF CU-BASED RESISTIVE RANDOM ACCESS MEMORY

RELATED APPLICATIONS

This application is a United States National Stage Application filed under 35 U.S.C 371 of PCT Patent Application Serial No. PCT/CN2016/080021, filed Apr. 22, 2016, the disclosure of all of which are hereby incorporated by reference in their entirety.

FIELD OF THE INVENTION

The present invention belongs to the technical field of integrated circuit manufacturing, and in particular to a preparation method of a Cu-based resistive random access memory, and a memory.

BACKGROUND OF THE INVENTION

As a novel non-volatile memory technology, the resistive random access memory has attracted a great deal of attention due to its high density, low cost and capability of breaking through the limitations of the technology. The materials used are phase change materials, metal oxide materials, organic materials and the like. A metal bridge type resistive random access memory dominated by Cu ions or Ag ions is one of the main types of resistive devices, and its structure is usually composed of active metal electrodes such as Cu or Ag, solid electrolyte materials (such as chalcogenide materials, metals oxides and the like), and inert electrodes (such as Pt, Pd, Ru, TaN and the like). Cu is widely used as an interconnecting wire material in an advanced semiconductor preparation process, and thus the Cu-based resistive random access memory may be integrated in a back end preparation process of a standard CMOS process easily.

The mechanism of the metal bridge type resistive random access memory may be described by the redox reaction of Cu or Ag ions. Taking a Cu-based resistive device as an example, during programming, Cu atoms are ionized by an electric field and then are injected into a solid electrolyte material to be reduced to Cu atoms through the combination with electrons, and when the metal electrodes on both ends are connected by a Cu metal filament, the resistance state of the device changes from a high resistance state into a low resistance state; and an erasing process is just opposite to the programming process, a metal conducting channel breaks under the action of an external electric field, and the resistance of the device changes from the low resistance state into the high resistance state.

Taking the interface between the Cu electrode and the solid electrolyte material as a reference, Cu ions are injected into the solid electrolyte material during programming, and the Cu ions are extracted during erasing. An important aspect of the reliability of the memory is the fatigue property, that is, the circular programming and erasing times of the device. Studies find that the fatigue property failure behavior of the Cu-based resistive random access memory is mainly low resistance state failure, which is caused by the accumulation of the Cu ions in the solid electrolyte material after multiple times of programming and erasing. How to reduce the injection efficiency of injecting the Cu ions into the solid electrolyte material to improve the cumulative effect of the Cu ions in the solid electrolyte material after multiple times of erasing becomes a technical problem that needs to be solved urgently to improve the fatigue property of the device.

SUMMARY OF THE INVENTION

The embodiment of the present invention provides a preparation method of a Cu-based resistive random access memory, and a memory, for reducing the injection efficiency of injecting Cu ions into a solid electrolyte material in the Cu-based resistive random access memory.

The embodiment of the present application provides a preparation method of a Cu-based resistive random access memory, including:

forming a copper wire in a groove through a Damascus copper interconnection process, wherein the copper wire includes a lower copper electrode for growing a storage medium, and the copper wire is arranged above a first capping layer;

forming a second capping layer above the copper wire;

forming a hole at a position corresponding to the lower copper electrode on the second capping layer, wherein the pore is used for exposing the lower copper electrode;

performing composition and a chemical combination treatment on the lower copper electrode to generate a compound barrier layer, wherein the compound barrier layer is a compound formed by the chemical combination of elements Cu, Si and N, or a compound formed by the chemical combination of elements Cu, Ge and N; and depositing a solid electrolyte material and an upper electrode on the compound barrier layer.

Optionally, the performing composition and a chemical combination treatment on the lower copper electrode to generate a compound barrier layer includes:

performing composition and a siliconization treatment on the lower copper electrode to generate the compound barrier layer of Cu, Si and N; or performing the composition and the siliconization treatment on the lower copper electrode to generate the compound barrier layer of Cu, Ge and N.

Optionally, the thickness of the compound barrier layer of Cu, Si and N or the compound barrier layer of Cu, Ge and N is 1-100 nm.

Optionally, after the depositing a solid electrolyte material and an upper electrode on the compound barrier layer, the method further includes:

patterning the deposited solid electrolyte material and the upper electrode to form the memory.

Optionally, the performing composition and a chemical combination treatment on the lower copper electrode to generate a compound barrier layer includes:

performing the siliconization treatment or a germanidation treatment on the lower copper electrode to generate the compound barrier layer, wherein the siliconization treatment is completed by a reaction in a silicon-containing gas, and the germanidation treatment is completed by the reaction in a germanium-containing gas.

Optionally, the siliconization treatment is completed by an ion injection method of silicon; or the germanidation treatment is completed by the ion injection method of germanium.

Optionally, prior to the performing the siliconization treatment or a germanidation treatment on the lower copper electrode to generate the compound barrier layer, the method further includes:

performing a reduction treatment on the exposed lower copper electrode in a hydrogen-containing gas.

Optionally, the performing the siliconization treatment or a germanidation treatment on the exposed lower copper electrode to generate the compound carrier layer includes:

performing the siliconization treatment on the lower copper electrode to obtain a compound of copper and silicon; and performing a desalination treatment on the compound of copper and silicon in a nitrogen-containing gas to obtain the compound barrier layer of Cu, Si and N; or performing the germanidation treatment on the lower copper electrode to obtain a compound of copper and germanium; and performing a nitrogen treatment on the compound of copper and germanium in the nitrogen-containing gas to obtain the compound barrier layer of Cu, Ge, and N.

The embodiment of the present application further provides a Cu-based resistive random access memory, including:

a copper wire and a first dielectric layer, wherein the copper wire is arranged in a groove of the first dielectric layer and is located above a first capping layer, and the copper wire includes a lower copper electrode for growing a storage medium;

a second capping layer arranged on the copper wire, wherein a pore is formed in a position corresponding to the lower copper electrode on the second capping layer;

a compound barrier layer embedded right below the pore in the lower copper electrode, wherein the compound barrier layer is a compound of elements Cu, Si and N or a compound of elements Cu, Ge and N;

a solid electrolyte material arranged above the compound barrier layer and the second capping layer and arranged on the inner side of the wall of the pore; and an upper electrode arranged on the solid electrolyte material.

Optionally, the thickness of the compound barrier layer is 1-100 nm.

The abovementioned one or more technical solutions in the embodiment of the present application at least have the following technical effects: when the Cu-based resistive random access memory is prepared, the compound containing Cu, Si and N or the compound barrier layer of Cu, Ge and N is inserted between the lower copper electrode and the solid electrolyte material to reduce the injection efficiency of Cu ions during programming, thereby solving the technical problem of higher injection efficiency of the Cu ions in the Cu-based resistive random access memory in the prior art, improving the accumulative effect of the Cu ions in the solid electrolyte material after multiple times of erasing, and improving the fatigue properties of the memory.

BRIEF DESCRIPTION OF THE DRAWINGS

Various other advantages and benefits will become apparent to those of ordinary skill in the art upon reading the following detailed description of the preferred embodiments. The drawings are only for the purpose of illustrating the preferred embodiments and are not construed as limiting the present invention. Moreover, in the whole drawings, the same reference signs are used for expressing the same components. In the drawings.

DETAILED DESCRIPTION OF THE EMBODIMENTS

Figure 1:
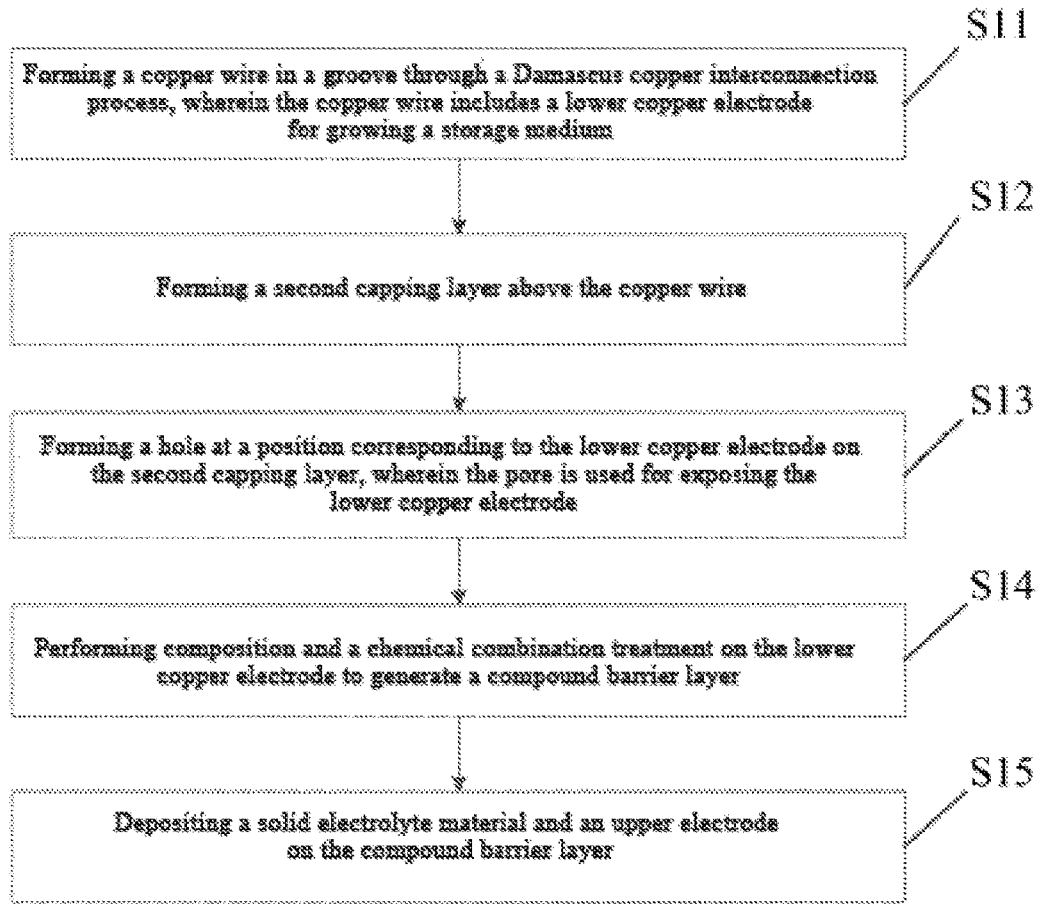
FIG. 1 is a schematic diagram of a preparation method of a Cu-based resistive random access memory provided by an embodiment of the present application.

Hereinafter, exemplary embodiments of the present disclosure will be described below in more details with reference to the drawings. Although the drawings show the exemplary embodiments of the present disclosure, it should be understood that the present disclosure may be implemented in various forms and should not be limited to the embodiments set forth herein. On the contrary, these embodiments are provided to understand the present disclosure more thoroughly and may fully convey the scope of the present disclosure to those skilled in the art.

The present invention is described more fully in reference embodiments below in combination with the drawings, the present invention provides preferred embodiments, but should not be considered as being limited to the embodiments set forth herein. In the drawings, the thicknesses of layers and areas are amplified for clarity, but should not be considered as strictly reflecting the proportional relation of any geometric sizes as schematic diagrams.

The reference figures herein are schematic diagrams of idealized embodiments of the present invention, the embodiments shown in the present invention should not be construed as being merely limited to the particular shapes of areas illustrated in the figures, but including the obtained shapes, such as manufacturing induced deviation. For example, a curve obtained by dry etching usually has a curved or rounded shape. However, in the drawings of the embodiments of the present invention, all of them are represented by rectangles. The representations in the figures are schematic, but this should not be construed as limiting the scope of the present invention.

Embodiment

Please refer to FIG. 1, the embodiment of the present application provides a preparation method of a Cu-based resistive random access memory, including:

S11: forming a copper wire in a groove through a Damascus copper interconnection process, wherein the copper wire includes a lower copper electrode for growing a storage medium, and the copper wire is arranged above a first capping layer;

S12: forming a second capping layer above the copper wire;

S13: forming a pore at a position corresponding to the lower copper electrode on the second capping layer, wherein the pore is used for exposing the lower copper electrode;

S14: performing composition and a chemical combination treatment on the lower copper electrode to generate a compound barrier layer, wherein the compound barrier layer is a compound formed by the chemical combination of elements Cu, Si and N, or a compound formed by the chemical combination of elements Cu, Ge and N; and S15: depositing a solid electrolyte material and an upper electrode on the compound barrier layer.

Figure 2:
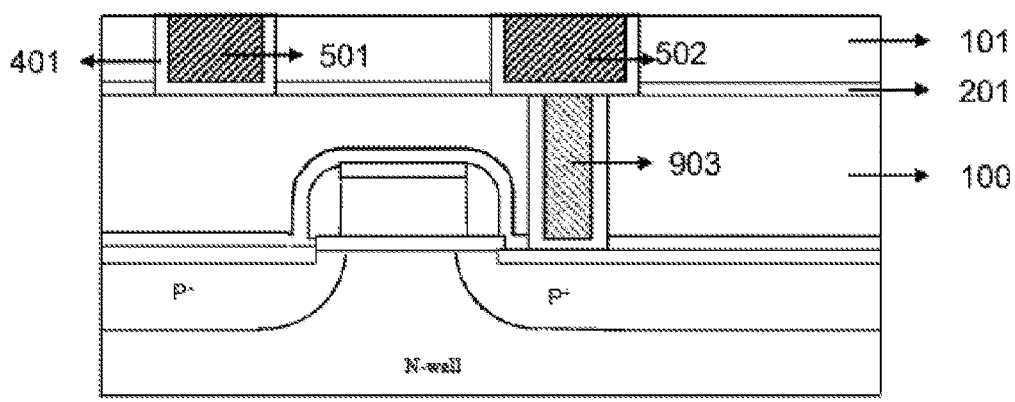
FIG. 2 is a schematic diagram of forming a copper wire when a Cu-based resistive random access memory is prepared provided by an embodiment of the present application.

Please refer to FIG. 2, it is a sectional view after the copper wire is formed in the groove by the Damascus copper interconnection process, and CMP (Chemical Mechanical Polishing, chemical mechanical polishing) is performed on the copper wire. The copper wire includes two portions 501 and 502, no storage medium is grown above the portion 501, the lower copper electrode for growing the storage medium is arranged above the portion 502, and the portion 502 is connected with an MOS device through a tungsten plug 903. The tungsten plug 903 is located in a second dielectric layer 100, and the second dielectric layer 100 is specifically an interlayer dielectric layer.

S11. The copper wire is formed in the groove through the Damascus copper interconnection process.

In the step, the groove may be formed in the first dielectric layer 101 at first, then a diffusion barrier layer 401 is formed in the inner wall of the groove, and the copper wire is formed in the groove with the diffusion barrier layer 401 formed in the inner wall. The first dielectric layer 101 is a PMD (Pre-Metal Dielectric, pre-metal dielectric) layer, which may be a dielectric material such as phosphorus-doped silicon oxide or PSG (Phosphosilicate Glass, phosphosilicate glass) and so on. The first capping layer 201 is located between the first dielectric layer 101 and the second dielectric layer 100. The material of the first capping layer 201 may be SiN, SiON, SiC, SiCN, or the like.

S12. The second capping layer 202 is formed above the copper wire.

Figure 3:
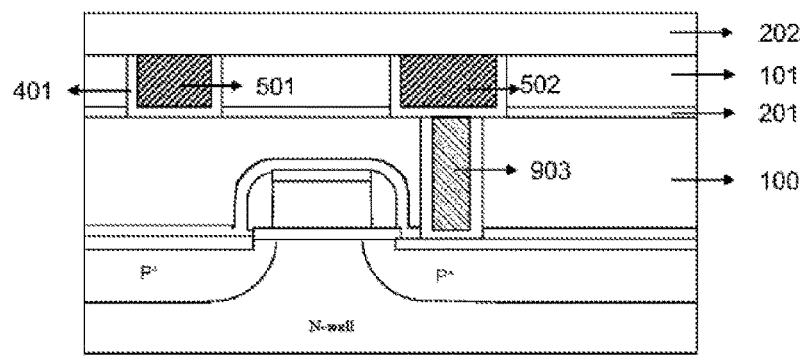
FIG. 3 is a schematic diagram of the preparation of a second capping layer of a Cu-based resistive random access memory provided by an embodiment of the present application.

Please refer to FIG. 3, in the step, the second capping layer may be deposited above the copper wire by PECVD (Plasma Enhanced Chemical Vapor Deposition, plasma enhanced chemical vapor deposition). Specifically, the second capping layer 202 is an SiN capping layer with a thickness range of 20-2000 nm.

S13, tapping is performed to expose the lower copper electrode 502.

Figure 4:
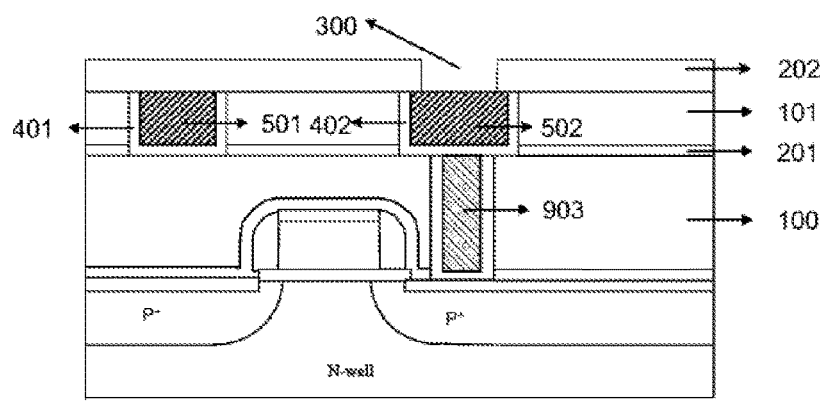
FIG. 4 is a schematic diagram of tapping when a Cu-based resistive random access memory is prepared provided by an embodiment of the present application.

Referring to FIG. 4, in the step, composition is performed on the second capping layer 202 on the lower copper electrode 502 to form a pore 300. The pore 300 is used for partially exposing the lower copper electrode 502, so that a siliconization treatment or a germanidation treatment may be performed on the exposed lower copper electrode 502 to generate the compound carrier layer. At the same time, the pore 300 is further used for defining the size of a unit area of a storage dielectric layer, that is, the size of the area of the lower copper electrode exposed from the pore 30 is the size of the unit area of the storage dielectric layer. The second capping layer 202 may be made of silicon oxide, silicon nitride and other materials, and the pore 30 may be formed in the second capping layer 202 by a photoetching or an etching method.

In an actual etching process, in order to avoid the oxidization of the copper wire caused by an ashing process when the photoresist is removed, a secondary etching process is usually adopted, the specific method is to photoetch the pattern of the pore at first, and then etch a part of the capping layer at the pore by dry etching, the photoresist is removed by using the ashing process, at this time, the capping layer at the pore is not completely etched so as to protect the beneath copper wire from being oxidized, and finally the pore is completely opened by secondary etching. For example, immediately after deposition, the second capping layer 202 is 100 nm, after the primary etching, the pore is opened by 50 nm, and then the photoresist is removed to perform the secondary etching to fully open the pore, and at this time, the thickness of the second capping layer 202 becomes 50 nm.

S14, the composition and the chemical combination treatment are performed on the lower copper electrode to generate a compound barrier layer 700b.

Figure 5:
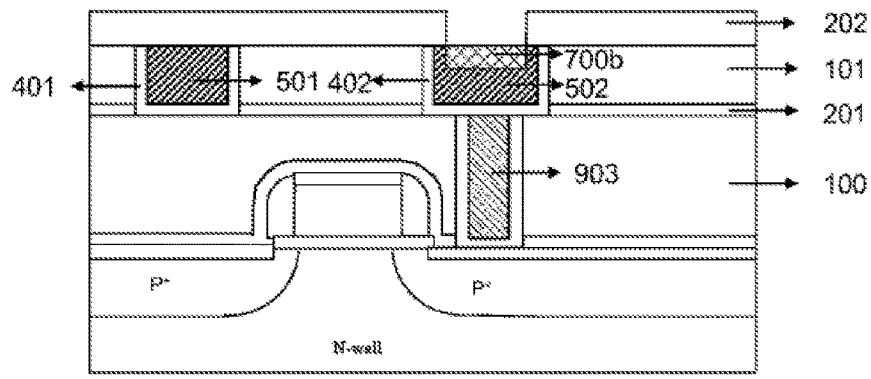
FIG. 5 is a schematic diagram of a chemical combination treatment when a Cu-based resistive random access memory is prepared provided by an embodiment of the present application.

Please refer to FIG. 5, in the step, the composition and the siliconization treatment or the germanidation treatment may be performed on the lower copper electrode 502 to generate a CuSiN or CuGeN compound barrier layer 700b, wherein CuSiN represents a compound of elements Cu, Si and N, and CuGeN represents a compound of elements Cu, Ge and N. The CuSiN or CuGeN layer may improve the low resistance state resistance of the device, thereby reducing the power consumption of the device. When the CuSiN or CuGeN is prepared, an autoregistration process may be adopted, the compound barrier layer is formed on the lower copper electrode 502 by autoregistration, therefore the preparation cost is low, and the problem of an expanded area of the device resulting from an additional metal insertion layer is avoided.

When the CuSiN or CuGeN compound barrier layer is prepared, the following specific steps may be contained:

Step 1, reduction treatment: performing a reduction treatment on the exposed lower copper electrode 502 in a hydrogen-containing gas to remove a native oxide layer on the Cu surface. The hydrogen-containing gas may be H2, H2O, an H2/N2 mixture, NH3 and the like. During the reduction treatment, the Cu may be exposed to the hydrogen-containing gas at a certain temperature (for example, 200° C.-500° C.), and the process may also be accompanied by the generation of plasma so as to reduce the CuOx on the surface layer to Cu.

Step 2, siliconization treatment or germanidation treatment: the method of siliconization or germanidation mainly includes: performing siliconization in a silicon-containing gas/performing germanidation in a germanium-containing gas; performing a surface treatment via silicon/germanium plasma; and performing a treatment by a silicon/germanium ion injection method.

With siliconization as an example, the following three manners are contained: (1) performing siliconization in a high temperature silicon-containing gas; (2) performing the surface treatment via silicon plasma; and (3) performing siliconization by an ion injection method of silicon. With the siliconization method (1) as an example, the lower copper electrode 502 is partially exposed to the silicon-containing gas at a certain high temperature (e.g., 200° C.-500° C.), the Cu metal chemically reacts with the gas to form a CuSi compound by siliconization. In the embodiment, the silicon-containing gas may be SiH4, SiH2Cl2, Si (CH3)4 and other gases, and the constant pressure of the chemical reaction is less than 20 Torr. The chemical reaction may be implemented in a silane (SiH4) atmosphere at a temperature of 100° C.-500° C. and a silane concentration of 0.01%-30% under a heating condition. In the method (3), during the ion injection of silicon, the second capping layer 202 functions as a mask layer at the same time, and the thickness range of the formed CuSi compound is 0.5-500 nm. It should be noted that CuSi does not represent a fixed chemical formula of the compound, and the stoichiometric ratio of copper to silicon is not merely limited to 1:1, the stoichiometric ratio is related to the formed process parameters, such as gas flow, temperature, time and the like. Similarly, the thickness range of a CuGe compound obtained from the germanidation treatment may also be 0.5 nm-500 nm, the CuGe also does not represent the fixed chemical formula of the compound, the stoichiometric ratio of copper to germanium is not merely limited to 1:1, and the stoichiometric ratio is related to the formed process parameters, such as gas flow, temperature, time and so on.

Step 3, nitrogen treatment: after the siliconization or germanidation is completed, the CuSi or CuGe compound may be further exposed to a nitrogen-containing gas for nitrogen treatment at a certain temperature (e.g., 100° C.-500° C.) to generate the CuSiN or CuGeN layer so as to form the compound barrier layer 700b. The nitrogen-containing gas may be N2, NH3 and the like, the process may also be accompanied by the generation of plasma, the CuSiN or CuGeN compound barrier layer 700b is finally generated, and the thickness of the compound barrier layer 700b may be 1-100 nm.

After the preparation of the compound barrier layer 700b is completed by the above steps 1 to 3, S15 is further executed.

S15, the solid electrolyte material 800 and the upper electrode 900 are formed on the CuSiN or CuGeN compound barrier layer 700b.

Figure 6:
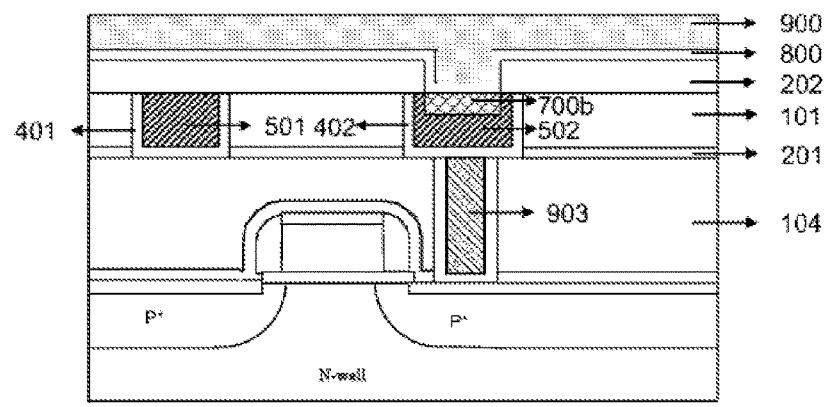
FIG. 6 is a schematic diagram of generating a solid electrolyte material and an upper electrode when a Cu-based resistive random access memory is prepared provided by an embodiment of the present application.

Please refer to FIG. 6, in the step, the structure as shown in FIG. 6 is formed by depositing the solid electrolyte material 800 (such as GeS, TaOx, HfOx, AlOx or the like) on the structure as shown in FIG. 5. The embodiment of the present application does not limit the category or the deposition method of the solid electrolyte material 800. The, the upper electrode 900 is formed on the solid electrolyte material 800. In the step, a metal conductive material (e.g., Ta, Ti, TaN and the like) may be deposited by PVD (Physical Vapor Deposition, which refers to realizing substance transfer via a physical process) to serve as the upper electrode 900 to cover the solid electrolyte material 800 so as to from the Cu-based resistive random access memory as shown in FIG. 6. The embodiment of the present application also does not limit the metal material type or the deposition method of the upper electrode 900.

Figure 7:
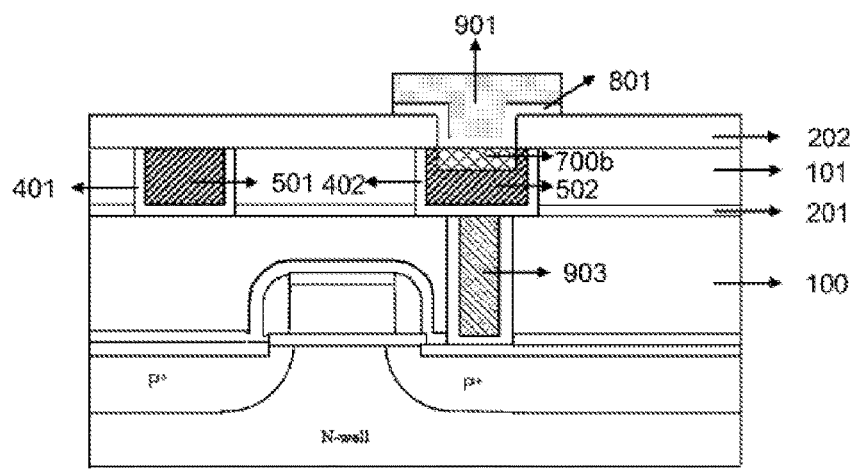
FIG. 7 is a schematic diagram of composition when a Cu-based resistive random access memory is prepared provided by an embodiment of the present application.

Further, please refer to FIG. 7, the embodiment of the present application may further perform composition on the solid electrolyte material 800 and the upper electrode 900, that is, pattern is performed on the solid electrolyte material 800 and the upper electrode 900 to form patterned solid electrolyte 801 and a patterned upper electrode 901. Specifically, an upper electrode pattern can be defined by photoetching at first, and then the pattern of the upper electrode and the solid electrolyte material is realized by dry etching or wet etching.

So far, the preparation process of the Cu-based resistive random access memory as shown in FIG. 1 is completed.

Based on the above-mentioned preparation method of the Cu-based resistive random access memory, the embodiment of the present application correspondingly provides a Cu-based resistive random access memory, and as shown in FIG. 7, the memory includes:

a copper wire and a first dielectric layer 101, wherein the copper wire is arranged in a groove of the first dielectric layer 101 and is located above a first capping layer 201, and the copper wire includes a lower copper electrode 502 for growing a storage medium;

a second capping layer 202 arranged on the copper wire, wherein a pore 300 is formed in a position corresponding to the lower copper electrode 502 on the second capping layer 202;

a compound barrier layer 700b embedded right below the pore 300 in the lower copper electrode 502, wherein the compound barrier layer 700b is a compound of elements Cu, Si and N or a compound of elements Cu, Ge and N;

a solid electrolyte material 801 arranged above the compound barrier layer 700b and the second capping layer 202 and arranged on the inner side of the wall of the pore 300; and an upper electrode 901 arranged on the solid electrolyte material 801.

The thickness of the compound barrier layer 700b is 1-100 nm for effectively preventing the oxidation of the Cu electrode during the growth of the solid electrolyte material 801 and improving the reliability and yield of the device.

By means of one or more embodiments of the foregoing technical solutions, at least the following technical effects are achieved:

1) The CuSiN or CuGeN compound barrier layer is inserted between the Cu electrode and the solid electrolyte material to modulate the injection efficiency of Cu ions during programming, improve the accumulative effect of the Cu ions in the solid electrolyte material after multiple times of erasing, and improving the fatigue properties of the device;

2) the CuSiN or CuGeN is formed on the Cu electrode by autoregistration, so that the preparation cost is low, and the problem of the expanded area of the device resulting from the additional metal insertion layer is avoided;

3) the CuSiN or CuGeN layer may effectively avoid the oxidation of the Cu electrode during the growth of the solid electrolyte material and improve the reliability and the yield of the device; and 4) the CuSiN or CuGeN layer may improve the low resistance state resistance of the device, thereby reducing the power consumption of the device.

In the description provided herein, numerous specific details are set forth. However, it may be understood that the embodiments of the present invention may be practiced without these specific details. In some instances, well-known methods, structures and techniques have not been shown in detail in order not to obscure the understanding of the description.

Similarly, it should be understood that in the foregoing description of the exemplary embodiments of the present invention, in order to simplify the present disclosure and help to understand one or more of the various inventive aspects, various features of the present invention are sometimes grouped together into single embodiments, figures or descriptions thereof. However, the method of the present disclosure should not be construed as reflecting the following intention: the claimed invention claims more features than the features that are specifically recited in each of the claims. Or rather, as the following claims reflect, the inventive aspects lie in less than all the features of a single foregoing disclosed embodiment. Thus, the claims following the detailed description are hereby expressly incorporated into the detailed description, wherein each claim is used as a single embodiment of the present invention.

Those skilled in the art may understand that although some of the embodiments described herein include some but not other features included in other embodiments, combinations of features of different embodiments are meant to be within the scope of the present invention and form different embodiments. For example, in the following claims, any one of the claimed embodiments may be used in any combination manner.

The invention claimed is:

1. A preparation method of a Cu-based resistive random access memory, comprising:

forming a copper wire in a groove through a Damascus copper interconnection process, wherein the copper wire includes a lower copper electrode for growing a storage medium, and the copper wire is arranged above a first capping layer;

forming a second capping layer above the copper wire;

forming a pore at a position corresponding to the lower copper electrode on the second capping layer, wherein the pore is used for exposing the lower copper electrode;

performing composition and a chemical combination treatment directly on the lower copper electrode to generate a compound barrier layer, wherein the compound barrier layer is a compound formed by the chemical combination of elements Cu, Si and N, or a compound formed by the chemical combination of elements Cu, Ge and N; and depositing a solid electrolyte material and an upper electrode on the compound barrier layer, wherein the compound barrier layer is configured to modulate the injection efficiency of Cu ions during programming and improve the accumulative effective of the Cu ions in the solid electrolyte material.

2. The method of claim 1, wherein the performing composition and a chemical combination treatment on the lower copper electrode to generate a compound barrier layer comprises:

performing composition and a siliconization treatment on the lower copper electrode to generate the compound barrier layer of Cu, Si and N; or performing the composition and the siliconization treatment on the lower copper electrode to generate the compound barrier layer of Cu, Ge and N.

3. The method of claim 2, wherein the thickness of the compound barrier layer of Cu, Si and N or the compound barrier layer of Cu, Ge and N is 1-100 nm.

4. The method of claim 1, wherein after the depositing a solid electrolyte material and an upper electrode on the compound barrier layer, the method further comprises:

patterning the deposited solid electrolyte material and the upper electrode to form the memory.

5. The method of claim 1, wherein the performing composition and a chemical combination treatment on the lower copper electrode to generate a compound barrier layer comprises:

performing the siliconization treatment or a germanidation treatment on the lower copper electrode to generate the compound barrier layer, wherein the siliconization treatment is completed by a reaction in a silicon-containing gas, and the germanidation treatment is completed by the reaction in a germanium-containing gas.

6. The method of claim 5, wherein the siliconization treatment is completed by an ion injection method of silicon; or the germanidation treatment is completed by the ion injection method of germanium.

7. The method of claim 5, wherein prior to the performing the siliconization treatment or a germanidation treatment on the lower copper electrode to generate the compound barrier layer, the method further comprises:

performing a reduction treatment on the exposed lower copper electrode in a hydrogen-containing gas.

8. The method of claim 5, wherein the performing the siliconization treatment or a germanidation treatment on the lower copper electrode to generate the compound carrier layer comprises:

performing the siliconization treatment on the lower copper electrode to obtain a compound of copper and silicon; and performing a desalination treatment on the compound of copper and silicon in a nitrogen-containing gas to obtain the compound barrier layer of Cu, Si and N; or performing the germanidation treatment on the lower copper electrode to obtain a compound of copper and germanium; and performing a nitrogen treatment on the compound of copper and germanium in the nitrogen-containing gas to obtain the compound barrier layer of Cu, Ge, and N.

9. A Cu-based resistive random access memory, comprising:

a copper wire and a first dielectric layer, wherein the copper wire is arranged in a groove of the first dielectric layer and is located above a first capping layer, and the copper wire comprises a lower copper electrode for growing a storage medium;

a second capping layer arranged on the copper wire, wherein a pore is formed in a position corresponding to the lower copper electrode on the second capping layer;

a compound barrier layer embedded right below the pore in the lower copper electrode, wherein the compound barrier layer is a compound of elements Cu, Si and N or a compound of elements Cu, Ge and N;

a solid electrolyte material arranged above the compound barrier layer; and an upper electrode arranged on the solid electrolyte material wherein the compound barrier layer is configured to modulate the injection efficiency of Cu ions during programming and improve the accumulative effective of the Cu ions in the solid electrolyte material.

10. The memory of claim 9, wherein the thickness of the compound barrier layer is 1-100 nm.

11. The method of claim 2, wherein the performing composition and a chemical combination treatment on the lower copper electrode to generate a compound barrier layer comprises:

performing the siliconization treatment or a germanidation treatment on the lower copper electrode to generate the compound barrier layer, wherein the siliconization treatment is completed by a reaction in a silicon-containing gas, and the germanidation treatment is completed by the reaction in a germanium-containing gas.

12. The method of claim 3, wherein the performing composition and a chemical combination treatment on the lower copper electrode to generate a compound barrier layer comprises:

performing the siliconization treatment or a germanidation treatment on the lower copper electrode to generate the compound barrier layer, wherein the siliconization treatment is completed by a reaction in a silicon-containing gas, and the germanidation treatment is completed by the reaction in a germanium-containing gas.

13. The method of claim 4, wherein the performing composition and a chemical combination treatment on the lower copper electrode to generate a compound barrier layer comprises:

performing the siliconization treatment or a germanidation treatment on the lower copper electrode to generate the compound barrier layer, wherein the siliconization treatment is completed by a reaction in a silicon-containing gas, and the germanidation treatment is completed by the reaction in a germanium-containing gas.

\* \* \* \* \*